US011750906B2

(12) United States Patent
Chen et al.

(10) Patent No.: US 11,750,906 B2
(45) Date of Patent: Sep. 5, 2023

(54) FULLY BURIED COLOR FILTER ARRAY OF IMAGE SENSOR

(71) Applicant: OMNIVISION TECHNOLOGIES, INC., Santa Clara, CA (US)

(72) Inventors: Gang Chen, San Jose, CA (US); Yuanwei Zheng, San Jose, CA (US); Qin Wang, San Jose, CA (US); Cunyu Yang, Los Gatos, CA (US); Guannan Chen, San Carlos, CA (US); Duli Mao, Sunnyvale, CA (US); Dyson H. Tai, San Jose, CA (US); Lindsay Alexander Grant, Campbell, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 17/558,199

(22) Filed: Dec. 21, 2021

(65) Prior Publication Data
US 2022/0116516 A1   Apr. 14, 2022

Related U.S. Application Data

(62) Division of application No. 16/539,931, filed on Aug. 13, 2019.

(51) Int. Cl.
*H04N 23/55* (2023.01)
*G02B 5/20* (2006.01)
(Continued)

(52) U.S. Cl.
CPC ............ *H04N 23/55* (2023.01); *G02B 5/201* (2013.01); *G02B 7/006* (2013.01); *H04N 23/54* (2023.01)

(58) Field of Classification Search
CPC .... H04N 5/2254; H04N 5/2253; H04N 23/55; H04N 23/54; G02B 5/201; G02B 7/006;
(Continued)

(56) References Cited

U.S. PATENT DOCUMENTS 9,437,645 B1 *   9/2016   Chou ................ H01L 27/14645
9,443,901 B2     9/2016   Kim
(Continued)

FOREIGN PATENT DOCUMENTS

CN   101438411 A   5/2009
CN   102347343 A   2/2012
(Continued)

OTHER PUBLICATIONS

Taiwanese Office Action, dated Apr. 8, 2021, issued in counterpart Taiwanese (ROC) Application No. 109126863, filed Jul. 13, 2020, 11 pages.
(Continued)

*Primary Examiner* — Albert H Cutler
(74) *Attorney, Agent, or Firm* — Christensen O'Connor Johnson Kindness PLLC

(57) ABSTRACT

An image sensor includes a substrate. An array of photodiodes is disposed in the substrate. A plurality of spacers is arranged in a spacer pattern. At least one spacer of the plurality of spacers has an aspect ratio of 18:1 or greater. A buffer layer is disposed between the substrate and the spacer pattern. An array of color filters is disposed in the spacer pattern.

20 Claims, 11 Drawing Sheets

(51) Int. Cl.
*G02B 7/00* (2021.01)
*H04N 23/54* (2023.01)
*G02B 3/00* (2006.01)
*H01L 27/146* (2006.01)

(58) Field of Classification Search
CPC ............ G02B 3/0056; H01L 27/14609; H01L 27/14621; H01L 27/14623; H01L 27/1463; H01L 27/14645; H01L 27/14683; H01L 27/14685

See application file for complete search history.

(56) References Cited

U.S. PATENT DOCUMENTS

| | | | |
|---|---|---|---|
| 10,304,885 B1 | 5/2019 | Chu et al. | |
| 10,462,431 B2 | 10/2019 | Huang et al. | |
| 11,189,652 B2 | 11/2021 | Oota et al. | |
| 2007/0238035 A1* | 10/2007 | Holscher | H01L 27/14621 430/7 |
| 2012/0019695 A1 | 1/2012 | Qian et al. | |
| 2012/0086091 A1 | 4/2012 | Crocherie | |
| 2014/0199801 A1 | 7/2014 | Kurihara et al. | |
| 2015/0130007 A1* | 5/2015 | Kawamura | H01L 27/14687 438/70 |
| 2016/0307942 A1 | 10/2016 | Cheng et al. | |
| 2018/0076247 A1* | 3/2018 | Pang | H01L 27/14627 |
| 2018/0301491 A1* | 10/2018 | Nakamoto | H01L 27/14 |
| 2019/0148434 A1* | 5/2019 | Hsu | H01L 27/14629 257/432 |
| 2019/0221596 A1 | 7/2019 | Oota et al. | |
| 2019/0267420 A1* | 8/2019 | Lee | H01L 27/14603 |
| 2019/0386049 A1 | 12/2019 | Jung | |
| 2020/0119072 A1* | 4/2020 | Lim | H01L 27/1462 |
| 2020/0258928 A1 | 8/2020 | Seo et al. | |

FOREIGN PATENT DOCUMENTS

| | | |
|---|---|---|
| CN | 106057834 A | 10/2016 |
| CN | 109003995 A | 12/2018 |
| CN | 109791235 A | 5/2019 |
| JP | 2010085754 A | 4/2010 |

OTHER PUBLICATIONS

Chinese Office Action and Search, dated Mar. 24, 2022, issued in counterpart Chinese Application No. 202010805617.6, filed Aug. 12, 2020, 12 pages.

* cited by examiner

FULLY BURIED COLOR FILTER ARRAY OF IMAGE SENSOR

CROSS-REFERENCE TO RELATED APPLICATION

The present application is a divisional of U.S. application Ser. No. 16/539,931, filed on Aug. 13, 2019, which is hereby incorporated by reference in its entirety.

BACKGROUND INFORMATION

Field of the Disclosure

The present invention relates generally to color filters, and more specifically, to color filter arrays of image sensors.

Background

Color image sensors include color filter arrays. Each color filter in the array of color filters may allow only one color of light to pass through to a sensor. A color filter array may include side walls between two adjacent color filters that isolate each color filter from neighboring color filters of the array of color filters. However, these side walls may take up a substantial amount of space and hurt color array filter occupancy density.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
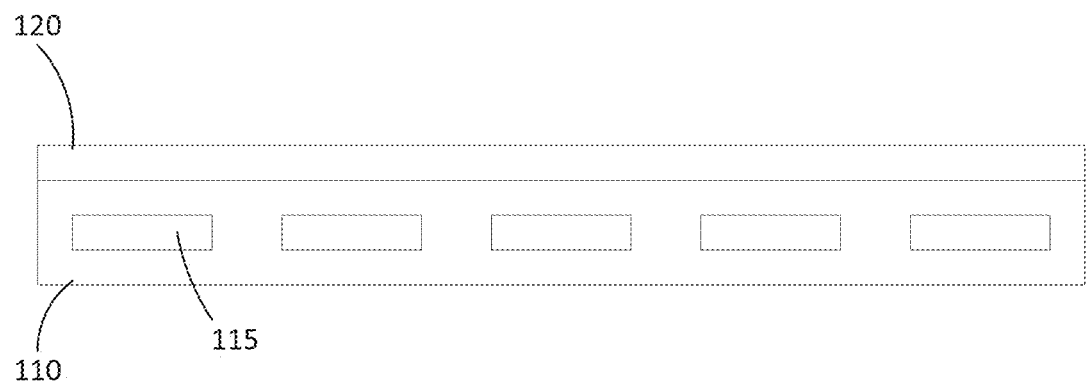
FIGS. 1A-1I illustrate an example of a cross section view of a fully buried color filter array at different steps of the formation of the array of color filters in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to arrays of color filters, and methods for fabricating the same using a sacrificial replacement layer are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Arrays of color filters with good photodiode isolation cause the photodiodes disposed below the array of color filters to be more accurate. Side walls isolating individual color filters in the array of color filters allow the array of color filters to have good photodiode isolation. However, the side walls formed by standard photolithography methods can take up a significant amount of space and hurt the occupancy density of the array of color filters.

FIGS. 1A-1I illustrate an example of a cross section view of a fully buried color filter array at different steps of the formation of the array of color filters in accordance with the teachings of the present invention. FIG. 1A illustrates an image sensor device with a substrate 110 including a plurality of photodiodes 115 and a buffer layer 120 disposed on the substrate 110. The substrate 110 may be a semiconductor material such as silicon substrate or a silicon substrate doped with impurities e.g., p-type doped silicon substrate or n-type doped silicon substrate. The photodiodes 115 may be formed in the substrate 110. In one embodiment, the photodiodes 115 may be n-type doped photodiodes formed by implanting and/or diffusing n-type impurities e.g., arsenic or phosphorous while the substrate 110 may be p-type doped silicon substrate. In another embodiment, the photodiodes 115 may p-type doped photodiode formed by implanting and/or diffusing p-type impurities e.g., boron while the substrate 110 may be n-type doped silicon substrate. The buffer layer 120 may be an oxide such as silicon dioxide or another material which is transparent to light in the visible spectrum. Each of the photodiodes 115 may generate photo-induced charge in response to incident light received.

Figure 1B:
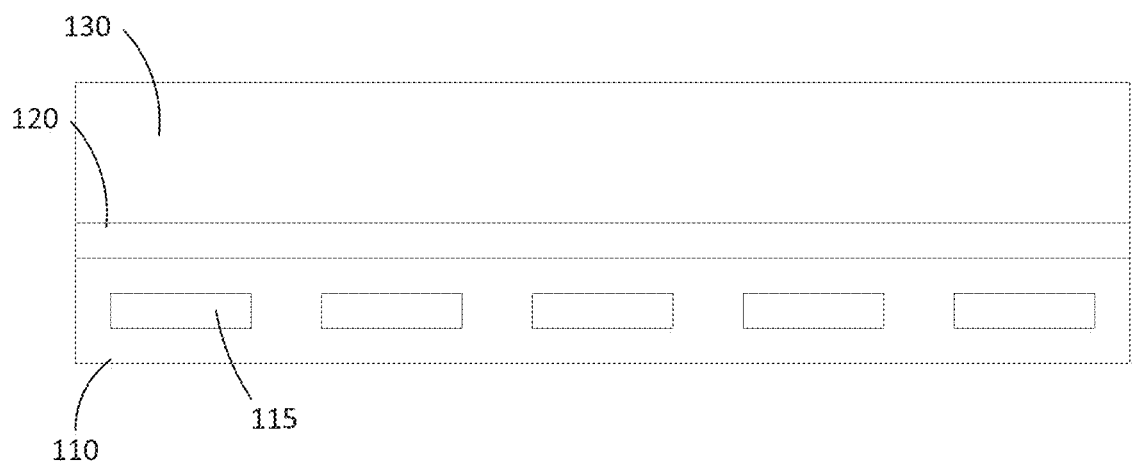

FIG. 1B illustrates the device of FIG. 1A with a layer of sacrificial material 130 formed on the buffer layer 120. The layer of sacrificial material 130 may be formed by depositing chemical vapor deposition. In one embodiment, the layer of sacrificial material 130 may be flattened by a chemical mechanical polishing (CMP) process. The sacrificial material may be a material which may be removed with a wet etching process, including but not limited to carbon-based material, oxide material, nitride material, silicon-based material. The sacrificial material may be a material which can be patterned by a dry etching process. As illustrated in FIG. 1B, the layer of sacrificial material 130 may be formed as a flat layer of uniform thickness. The layer of sacrificial material 130 should be made of a material that when removed by a wet etching process will not cause the buffer layer 120 to be substantially removed as well. For example, if the buffer layer 120 is silicon dioxide, the layer of sacrificial material 130 should not also be silicon dioxide. Restated, the buffer layer 120 and the layer of sacrificial material 130 may be made of different materials where the sacrificial material is etch selective from the buffer layer 120. In other words, the material for forming the layer of sacrificial material 130 may be selected from materials having different etching rate than the material for forming the buffer layer 120. In one embodiment, the layer of sacrificial material may be made from nitride material and the buffer layer 120 may be made from silicon dioxide.

Figure 1C:
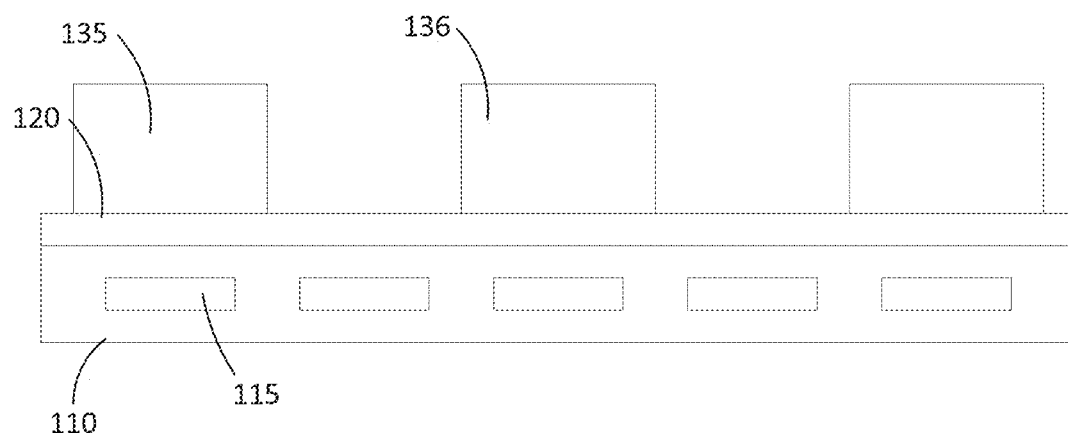

FIG. 1C illustrates the device of FIG. 1B with parts of the layer of sacrificial material 130 removed to form a pattern of sacrificial material 135. As will be described in greater detail below, the pattern of sacrificial material 135 may be a "checkerboard" pattern. The pattern of sacrificial material 135 may be formed by patterning and dry etching the layer of sacrificial material 130 according to the "checkerboard" pattern. In an embodiment, the pattern of sacrificial material 135 may form blocks of sacrificial material 136. Each one of the blocks of sacrificial material 136 may have a rectangular prism shape such that the block of sacrificial material has four sides of about equal length. As illustrated in FIG. 1C, the blocks of sacrificial material 136 are spaced apart in one direction by about the length of one of the sides of the blocks of sacrificial material 136. In other embodiments, the blocks of sacrificial material 136 may have 4 sides not having equal length. The shape and the size of the blocks of sacrificial material may depend upon the desired sizes and shape for the spacers and the color filters for the imaging sensor device. Each block of sacrificial material 136 may cover one photodiode 115 and be centered on the respective photodiode 115. Alternatively, each block of sacrificial material may cover multiple photodiodes 115. The thickness or height of the blocks of sacrificial material 136 may be configured based on the desired thickness or height for the spacer.

Figure 1D:
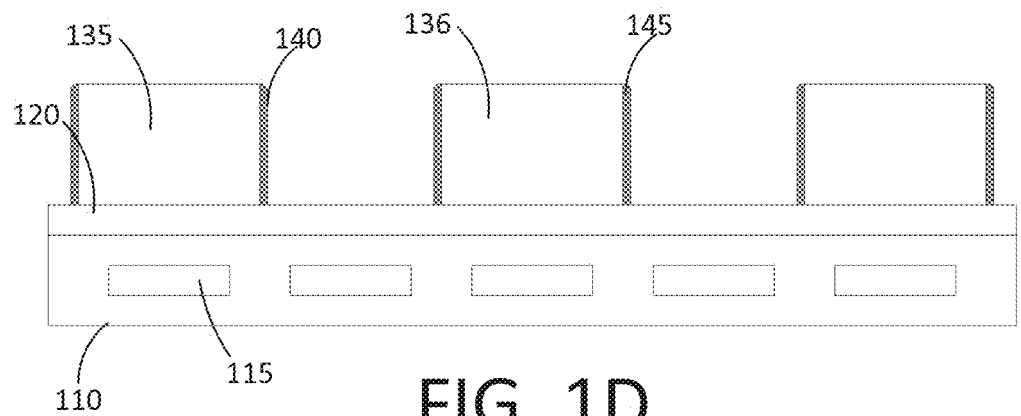

FIG. 1D illustrates the device of FIG. 1C with a spacer pattern 140 formed on the sides of the blocks of sacrificial material 136. The spacer pattern 140 may be formed of individual spacers 145 formed on individual sides of the blocks of sacrificial material 136, for example by atomic layer deposition (ALD) or chemical vapor deposition (CVD). In one embodiment, the spacers 145 may be formed as a continuous spacer grid. In one embodiment, the width of each individual spacer 145 may range between 0.01-0.1 um. The width of the spacers 145 may be defined by the space between the blocks of sacrificial material 136 and may be thinner than the minimum critical dimension (CD) of the lithographic patterning and etching process. In one embodiment, the individual spacers 145 may be less than or equal to 0.05 µm thick. The individual spacers 145 may come in contact with each other at points between corners of the blocks of sacrificial material 136. The spacer pattern 140 may be thicker than 0.05 µm at the corners where the spacers 145 connect. Restated, the aspect ratio (height to width ratio) of the spacers 145 may be up to 18:1 or even greater.

The spacer pattern 140 is made of a spacer material that has etch selectivity against the sacrificial material and the buffer layer 120. The spacer material may also have a refractive index as low as of 1.3 or even less. The material for forming the spacers 145 may be selected based on the applications of the image sensor device or the optical performance required for the image sensor device. In one embodiment, each of the spacers 145 may be a single or multilayer-stack structure. In one embodiment, the material for forming the spacers 145 may be oxide material, nitride material, or a material with low index of refraction (e.g., a material having index of refraction lower than 1.3). In another embodiment, the material for forming the spacers 145 may be a material with high reflectivity, such as metal. In one embodiment, the spacer may be formed by a combination of metal and dielectric material, for example formed of metal material (e.g., tungsten or aluminum) enclosed by a layer of dielectric material e.g., silicon oxide In an embodiment, the process of forming the spacers 145 (discussed below) causes a first side of the spacer 145 facing away from the pattern of sacrificial material to have a slated portion near the top of the spacer 145, which is not completely vertical and slanted toward the block of sacrificial material. Accordingly, the first side has a first slant. A second side of the spacer 145 facing the block of sacrificial material will be more vertical or may be slightly slanted away from the vertical portion of the spacer 145. Accordingly, the second side has a second slant that is different from the first slant. Restated, the second side of the spacer 145 facing the block of sacrificial material may conform to the shape of the block of sacrificial material and have a different slant than the first side of the spacer 145 facing away from the block of sacrificial material.

Figure 1E:
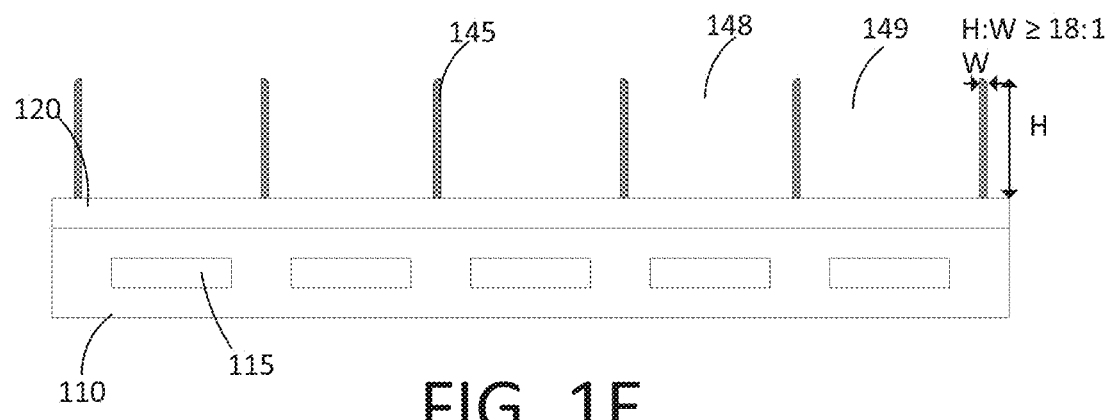

FIG. 1E illustrates the device of FIG. 1D with the pattern of sacrificial material 135 removed. When the sacrificial material is removed, a free standing spacer pattern 140 remains. As will be further explained below, the free standing spacer pattern 140 defines first openings 148 and second openings 149 between four spacers 145. Each of the first openings 148 is defined by four first sides of spacers 145. Each of the second openings 149 is defined by four second sides of the spacers 145. Restated, the first openings 148 are adjacent only to first sides of the spacers 145, and the second openings 149 are adjacent only to second sides of the spacers 145. The first openings 148 will allow in slightly more light than the second openings 149 based on the geometry of the tops of the spacers 145.

Figure 1F:
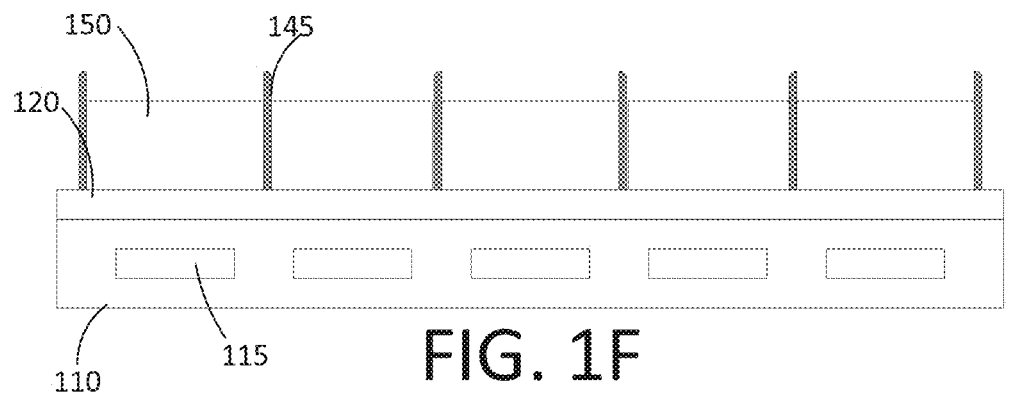

FIG. 1F illustrates the device of FIG. 1E with an array of color filters 150 formed by depositing color filter material in the first and second openings 148, 149. In one embodiment, the color filters array 150 may be a Bayer filter mosaic with a pattern of four color filters (two greens filters, one red filter, and one blue filter) clustered together repeating throughout the array of color filters. In one embodiment, the color filter material may include red color filter material, blue color filter material, and green color filter material. In one example, Bayer pattern filter mosaic is used and the first openings 148 are filled with the red and blue color filters to slightly improve the sensitivity of the red and blue photodiodes compared to the green photodiodes. In another example, the Bayer pattern filter mosaic is used and the first openings 148 are filled with the green color filters. In another embodiment, the array of color filters 150 may include a different pattern of color filters, such as CMYK and the color filter material may be comprised of cyan color filter material, magenta color filter material, and yellow color filter material. The specific arrangement of color filters for the array of color filters 150 may depend on the applications of the image sensor device. It would be appreciated by those skilled in the art that the material for forming color filters may have an index of refraction that is higher than the corresponding spacers 145 formed in between and the buffer layer 120. Alternative, the material selected for the spacers 145 may have index of refraction lower than the color filter material.

Figure 1G:
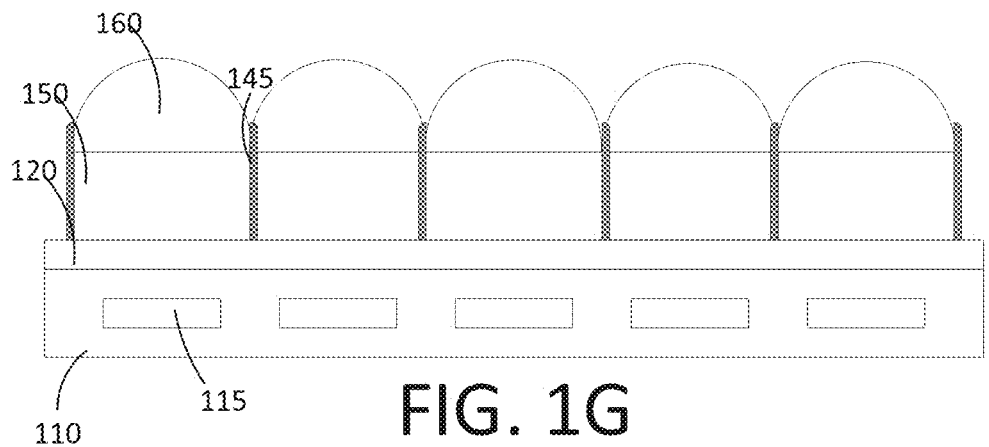

FIG. 1G illustrates the device of FIG. 1F with an array of microlenses 160 formed on the array of color filters 150. The microlenses 160 are configured to focus incident light to the respective photodiodes 115. In one embodiment, the microlenses 160 may be made of a microlens material such as polymer. The microlenses 160 may be domed, or otherwise shaped to operate as a lens based on a difference in refractive index from the air to the microlens material. The curvature of each microlens may be configured based on the required optical performance (e.g., focal length) for the respective photodiode 115.

FIG. 1G illustrates an image sensor device with fully buried color filter array. The substrate 110 has an array of photodiodes 115 disposed in the substrate 110. Buffer layer 120 is formed on the substrate 110. Spacers 145 form a spacer pattern 140. The spacer pattern 140 is formed on the buffer layer 120 such that the buffer layer 120 is between the spacers 145 and the substrate 110. The array of color filters 150 is disposed within the first and second openings 148, 149 of the spacer pattern 140 such that the array of color filters 150 is disposed in the spacer pattern 140.

Figure 1H:
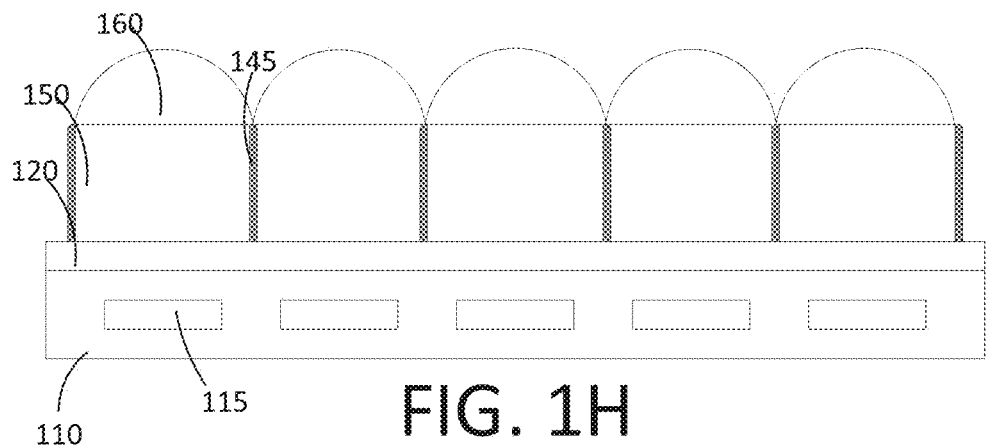
Figure 1I:
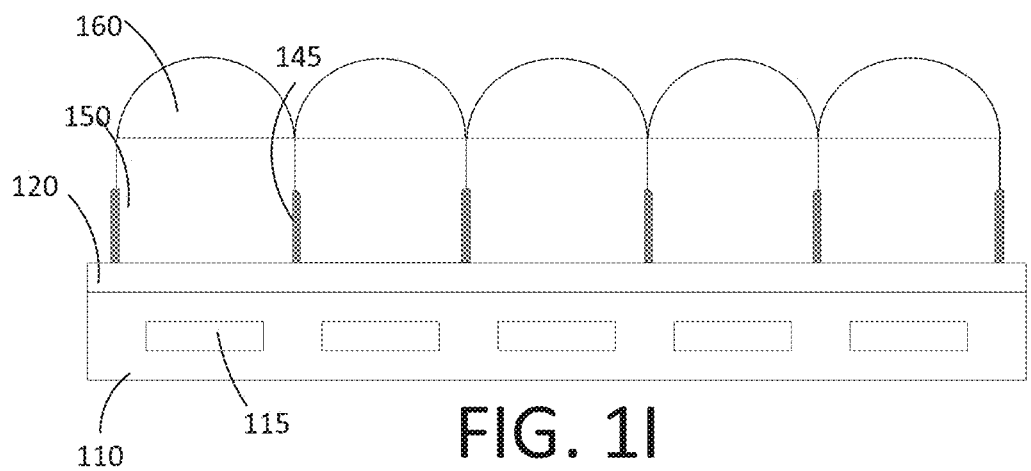

The height of spacers 145 may be configured based on the desired optical performance of color filter and microlens array. In the embodiment of FIG. 1G, the color filters in the array of color filter 150 may have a height less than a height of the spacers 145. In another embodiment, the color filters in the array of color filter 150 may have a height same as a height of the spacers 145 as illustrated by FIG. 1H. In another embodiment, the color filters in the array of color filter 150 may have a height greater than the height of the spacers 145 as illustrated by FIG. 1I.

As pixels continue to shrink, the area used to ensure color filter isolation becomes more important. Examples in accordance with the teachings of the present invention provide significant advantages in both color filter isolation and density. The spacers 145 provide improved color filter isolation to the array of color filters 150. In one example, the spacers 145 are formed of a material having a refractive index lower than a refractive index of each one of the color filters of the array of color filters 150. This material property of the spacers 145 and the array of color filters 150 causes photons to reflect off the spacers 145 rather than pass through the spacers 145. Thus, the color filters are better isolated from light passing through the neighboring color filters and color filter isolation is improved even with a thin spacer 145.

The image sensor device can have the advantage of having tall and thin spacers 145 between the color filters, which prevent light coming from a direction other than a top side of the device from being directed into the photodiode 115. Thus, the spacers 145 prevent corruption of the photodiode output. The thin spacers 145 also provide the advantage of not occupying an excessive amount of the area of the fully buried color filter array when viewed from above. Photodiodes 115 require a minimum amount of light to sense properly an incident light source. Thus, photodiodes 115 need a certain amount of area to collect light using the microlens 160 to operate properly. The amount of area needed is dependent on the lighting conditions, among other factors. The small area of the spacers 145 when viewed from above allows more photons to pass through the microlenses 160 to the photodiodes 115 rather than colliding with the spacers 145 and thus allows the array of color filters 150 and photodiodes 115 to take maximum effective area of the array and have better quantum efficiency. The height and isolation effects of the spacers 145 also provides for better angular response by the image sensor.

Figure 2A:
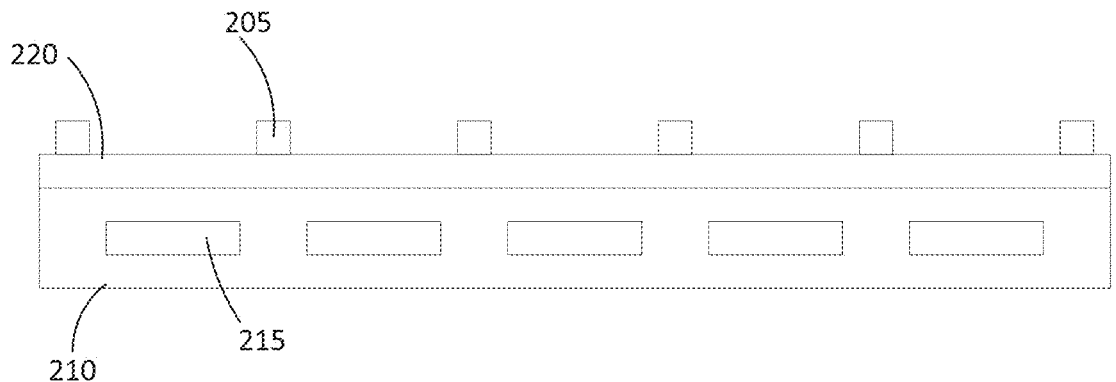
FIGS. 2A-2H illustrate an example of a cross section view of a fully buried color filter array at different steps of the formation of the array of color filters in accordance with the teachings of the present invention.

FIGS. 2A-2H illustrate another example of a cross section view of a fully buried color filter array at different times during fabrication of the fully buried color filter array in accordance with the teachings of the present invention. FIG. 2A illustrates an image sensor device similar to that of FIG. 1A. FIG. 2A illustrates a pattern of support material 205 disposed on the buffer layer 220. The buffer layer 220 is disposed on a substrate 210 including a plurality of photodiodes 215.

The pattern of support material 205 may be metal or a metalloid such as tungsten or aluminum. The pattern of support material 205 should be a material that is etch selective from the buffer layer 220 and a layer of sacrificial material 230 (discussed below). In one embodiment, the support material 205 may further direct incident light to the respective photodiodes 205 by reflection or refraction, such that optical cross talk between neighboring photodiodes may be suppressed.

Figure 2B:
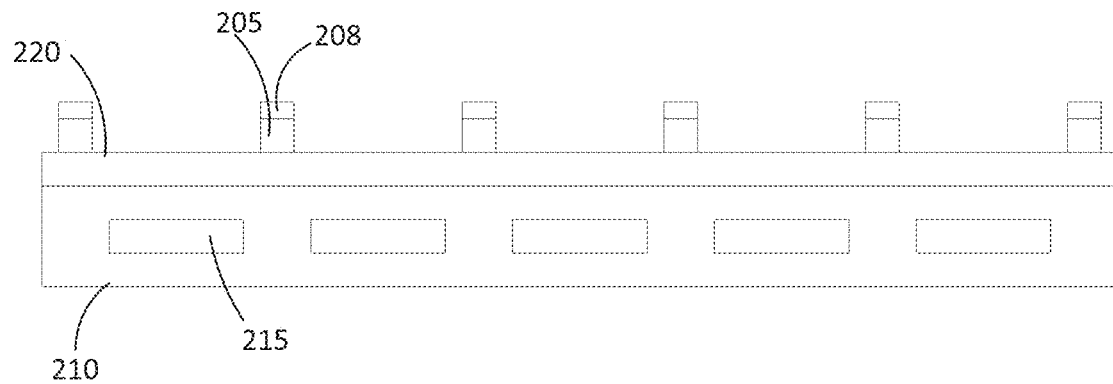

FIG. 2B illustrates the image sensor device of FIG. 2A with an adhesive layer 208 on the pattern of support material 205. The adhesive layer 208 may be titanium nitride (TiN). The adhesive layer 208 may cover a top surface of the pattern of support material 205. The adhesive layer should be etch selective from the buffer layer 220 and the layer of sacrificial material 230 (discussed below).

Figure 2C:
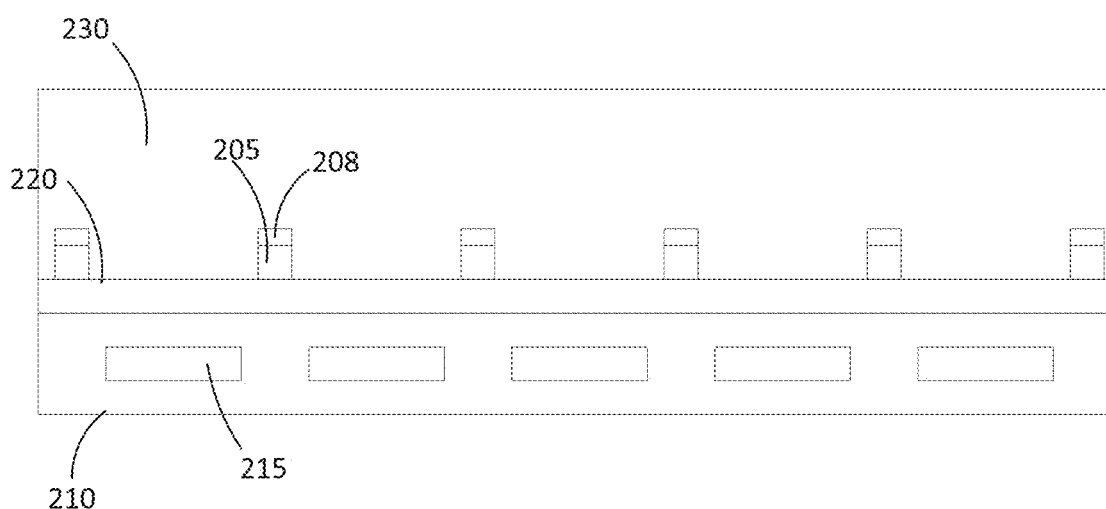

FIG. 2C illustrates the image sensor device of FIG. 2B with the layer of sacrificial material 230 formed on the pattern of support material 205, the adhesive layer 208 and the buffer layer 220. The layer of sacrificial material 230 may be made of the same material and formed by the same process as discussed with relation to the layer of sacrificial material 130.

Figure 2D:
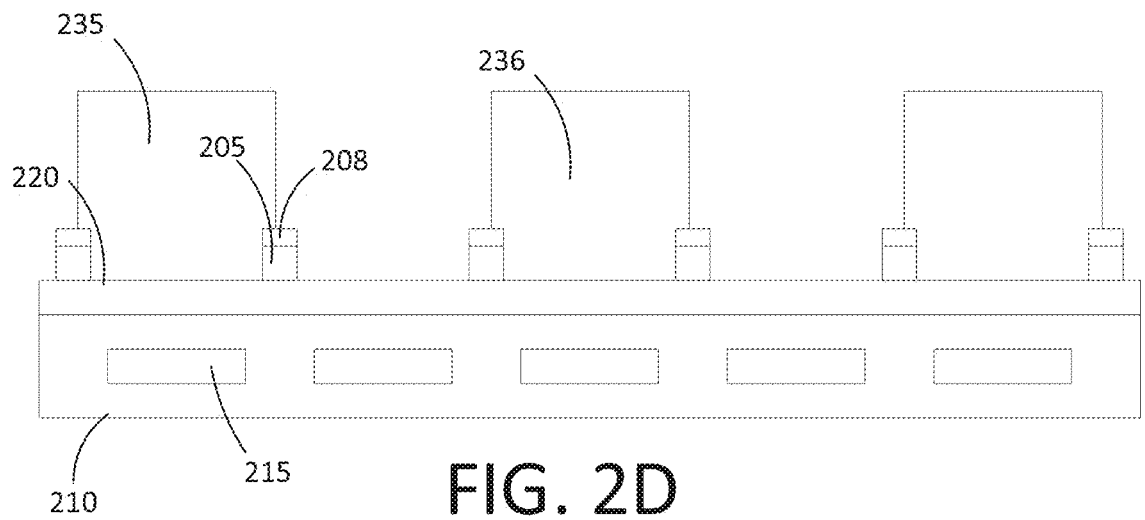

FIG. 2D illustrates the image sensor device of FIG. 2C with a pattern of sacrificial material 235 etched from the layer of sacrificial material 235. The pattern of sacrificial material 235 may include blocks of sacrificial material 236. The blocks of sacrificial material 236 may be centered in an opening in a grid formed by the pattern of support materials 205. As such, each block of sacrificial material 236 is in contact with four portions of the grid that is formed by the pattern of support materials 205, which define the opening in the pattern of support material 205. Each block of sacrificial material 236 may cover about half of the four portions of the pattern of support material 205 and the adhesive layer on top of the four portions of the pattern of support material 205.

Figure 2E:
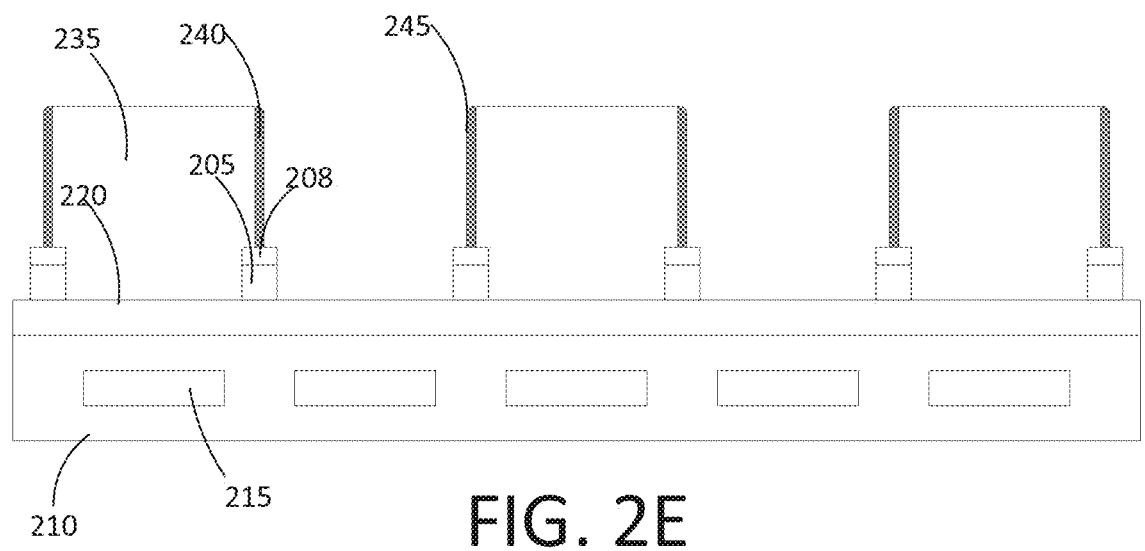

FIG. 2E illustrates the image sensor device of FIG. 2D with a spacer pattern 240 formed on side walls of the pattern of sacrificial material 235. The spacer pattern 240 may be disposed on top of the adhesive layer 208 and pattern of support material 205 in the center of the adhesive layer. The spacers 245 forming the spacer pattern 240 may be made of the same material, have the same properties, and be formed in the same way as disclosed above with relation to the spacer pattern 140 except that the spacer pattern 240 is formed on the adhesive layer 208. In one embodiment, the spacer pattern 240 may be in a form of a continuous pattern, thus the spacers 245 can be formed as a continuous spacer grid.

A height of the spacer pattern 240 may be limited by the strength of the material used to form the spacer pattern 240 and/or the process of forming the spacers 245. By forming the spacer pattern 240 on the adhesive layer 208 on the pattern of support material 205 rather than directly on the buffer layer 220, the height of the first and second openings 248, 249 formed by the combination of the pattern of support material 205, adhesive layer 208, and spacer pattern 240 may extend further from the buffer layer 220 than the first and second openings 148, 149 in the spacer pattern 140 from the buffer layer 120.

Figure 2F:
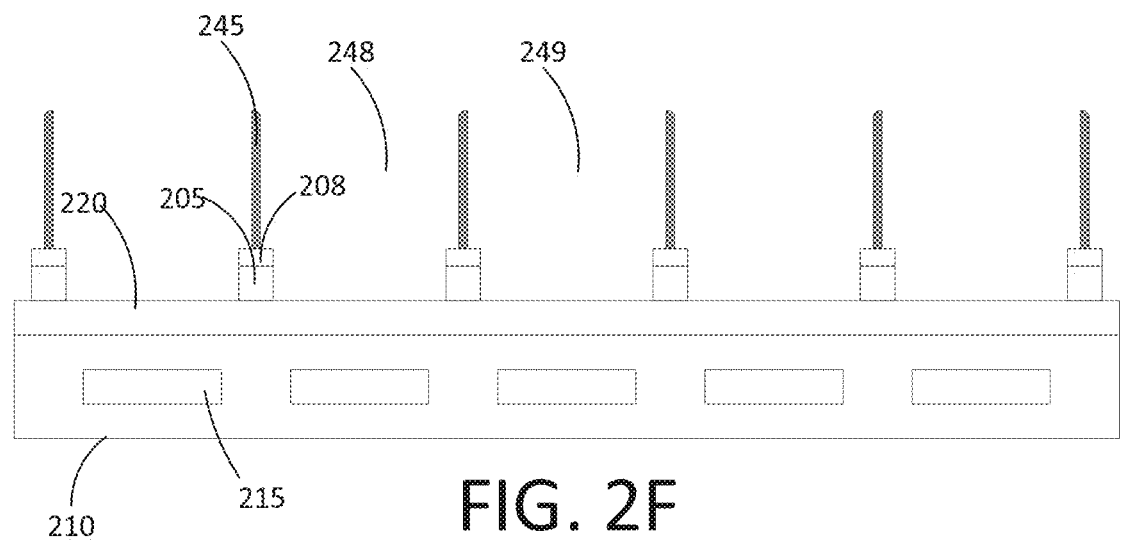

FIG. 2F illustrates the image sensor device of FIG. 2E with the pattern of sacrificial material 235 removed. The pattern of sacrificial material 235 may be removed by the same process as described below with relation to the pattern of sacrificial material 135.

Figure 2G:
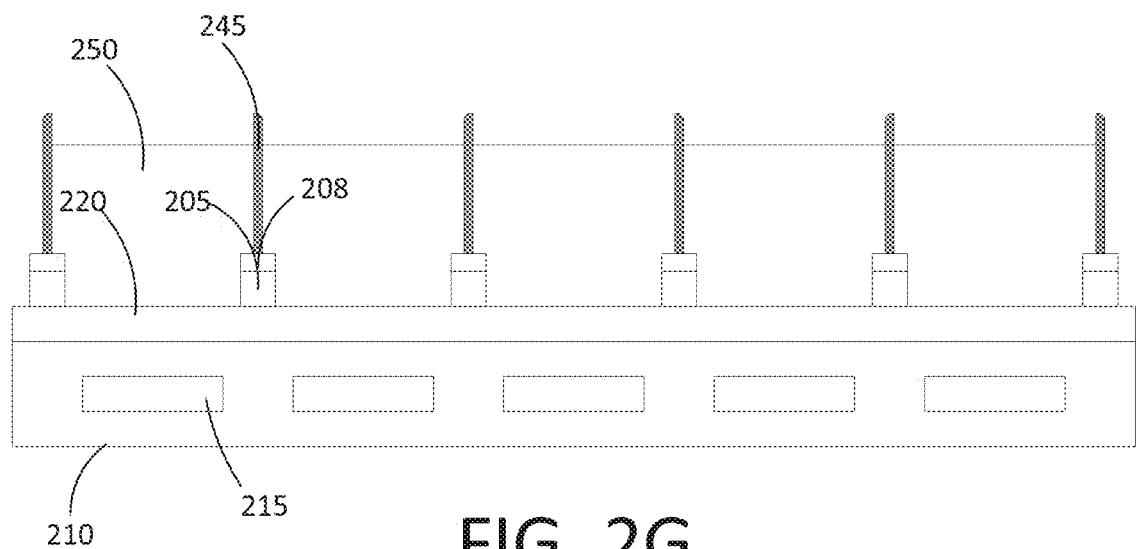

FIG. 2G illustrates the image sensor device of FIG. 2F with an array of color filters 250 disposed in the first and second openings 248, 249. Each color filter 250 is formed between two adjacent spacers 245. The array of color filters 250 may be formed of the same material, have the same properties, and be formed in the same way as the array of color filters 150, except that the array of color filters 250 may have a height less, the same, or greater than the height of the spacer 245. Therefore, the array of color filters 250 will have a height greater, or less than or equal to the combined height of the spacers 245, the adhesive layer 208, and the pattern of support material 205. Restated, the spacer pattern 240 on the adhesive layer 208 and pattern of support material 205 may extend further from the buffer layer 220 than the array of color filters 250.

Figure 2H:
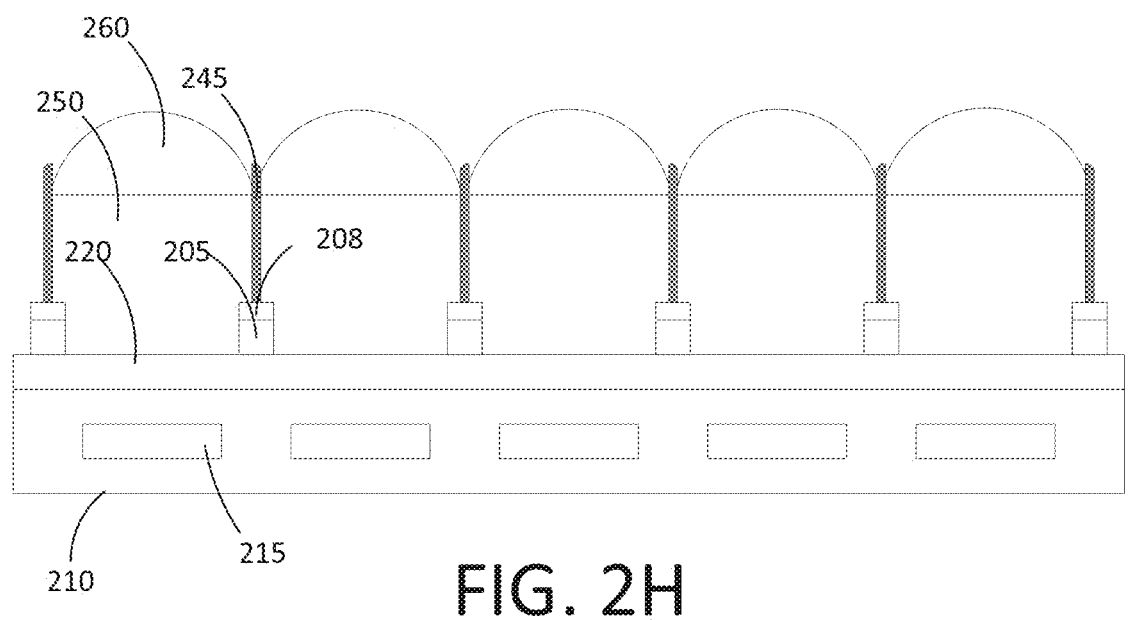

FIG. 2H illustrates the device of FIG. 2G with microlenses 260 formed on the array of color filters 250. The microlenses 260 may be formed of the same material, have the same properties, and be formed in the same way as the microlenses 160. The focal lengths of the each microlens 260 may depend upon on the height of color filters 250. As such, the height of the array of color filters 250 may be configured based on the desired optical performance for the image sensor device.

FIG. 2H illustrates an image sensor device with a fully buried color filter array. The substrate 210 has an array of photodiodes 215 disposed in the substrate 210. Buffer layer 220 is formed on the substrate 210. A pattern of support material 205 is formed on the buffer layer 220 such that the buffer layer 220 is between the pattern of support material 205 and the substrate 210. An adhesive layer is formed on the pattern of support material 205 such that the pattern of support material and the buffer layer 220 are between the adhesive layer 208 and the substrate 210. Spacers 245 form a spacer pattern 240. The spacer pattern 240 is formed on the buffer layer such that the buffer layer 220, pattern of support material 205 and adhesive layer 208 are between the spacers 245 and the substrate 210. The array of color filters 250 is disposed within the first and second openings 248, 249 of the spacer pattern 240 such that the array of color filters 150 is disposed in the spacer pattern 240 and the pattern of support material 205.

The embodiment shown in FIG. 2H provides even greater color filter isolation than the embodiment shown in FIG. 1G, while providing similar color filter array occupancy density. Some photo image sensors may require very high color filter isolation and large color filter occupancy density. However, the height of spacers 145 for a given thickness may be limited by the strength of the spacer material such that the spacer height needed for color filter isolation requires a spacer thickness too great for the required color filter array occupancy density. This problem may be solved by placing the spacers 245 on the pattern of support material 205 and adhesive layer 208. This increases the distance which the spacers 245 extend from the buffer layer 220 without increasing the area taken up by the spacer at the top of the array of color filters 250. The microlens 260 focuses light toward a center of the color filter toward a photodiode 215 disposed below the center of the base of color filter. Accordingly, the extra area taken up by the pattern of support material 205 at the bottom of the color filter does not have much effect on the photodiode 215, and the array of color filters 250 may maintain the same density as the array of color filters 150 illustrated in FIG. 1G.

Figure 3A:
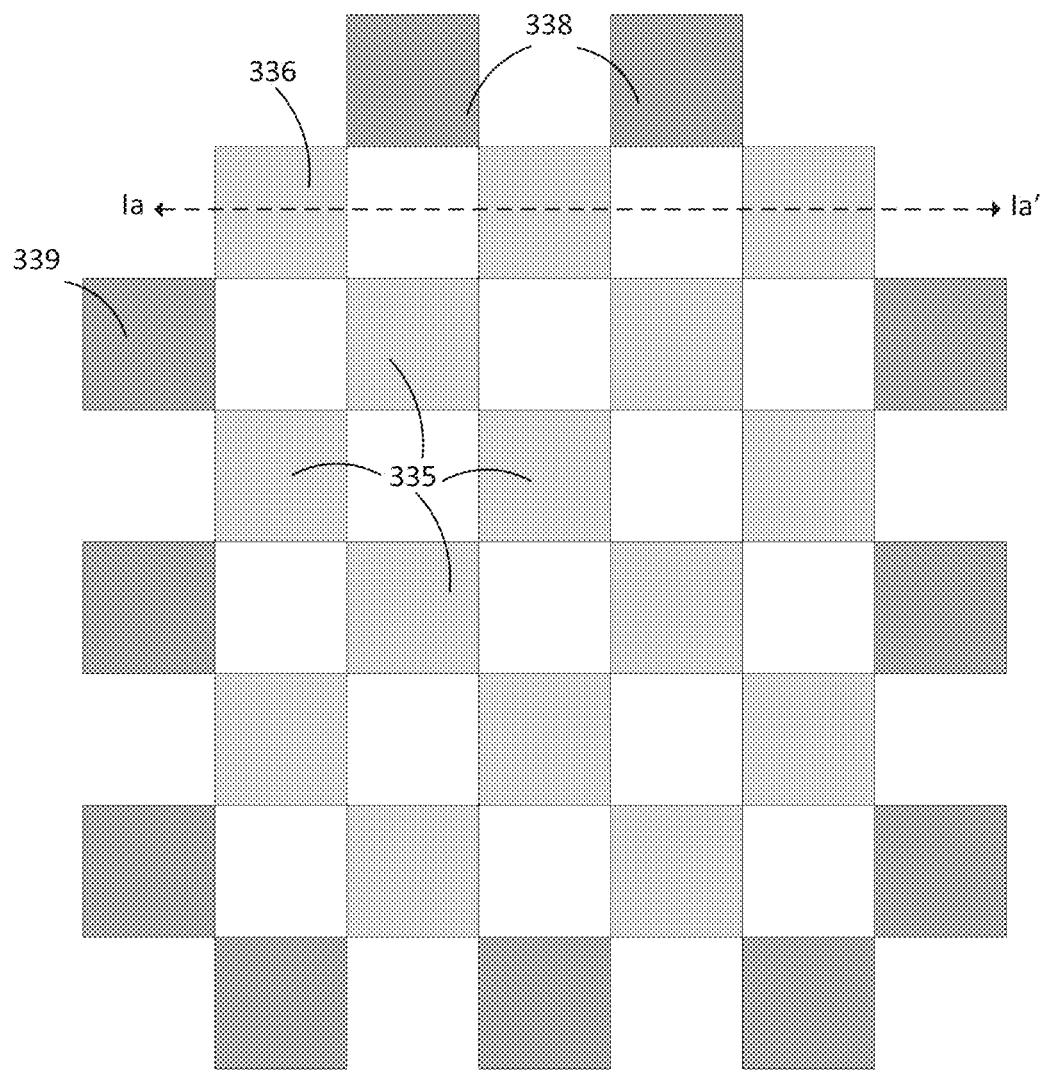
FIGS. 3A-3C illustrate example top down views of a fully buried color filter array at different steps of the formation of the array of color filters in accordance with the teachings of the present invention.
Figure 3B:
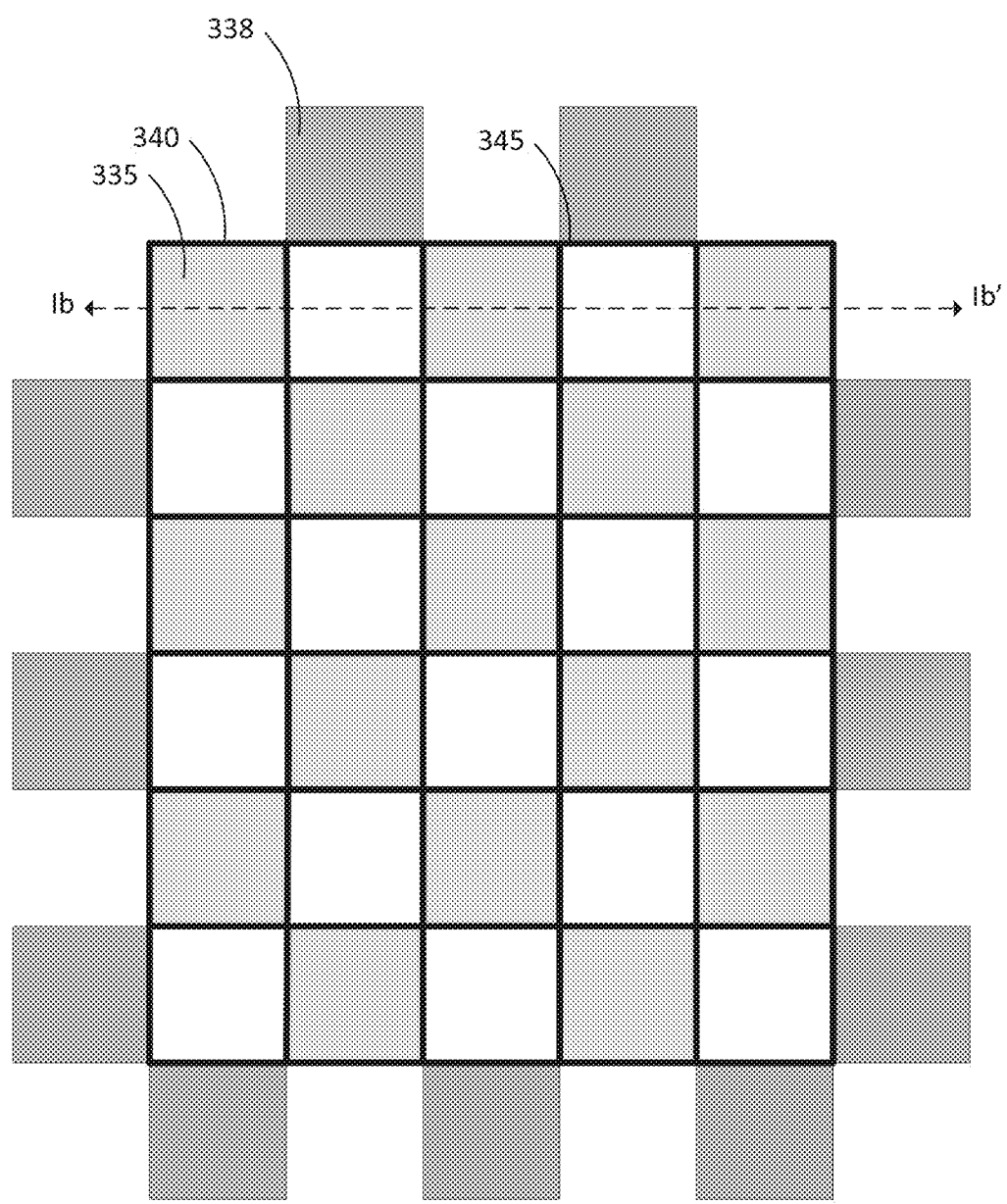
Figure 3C:
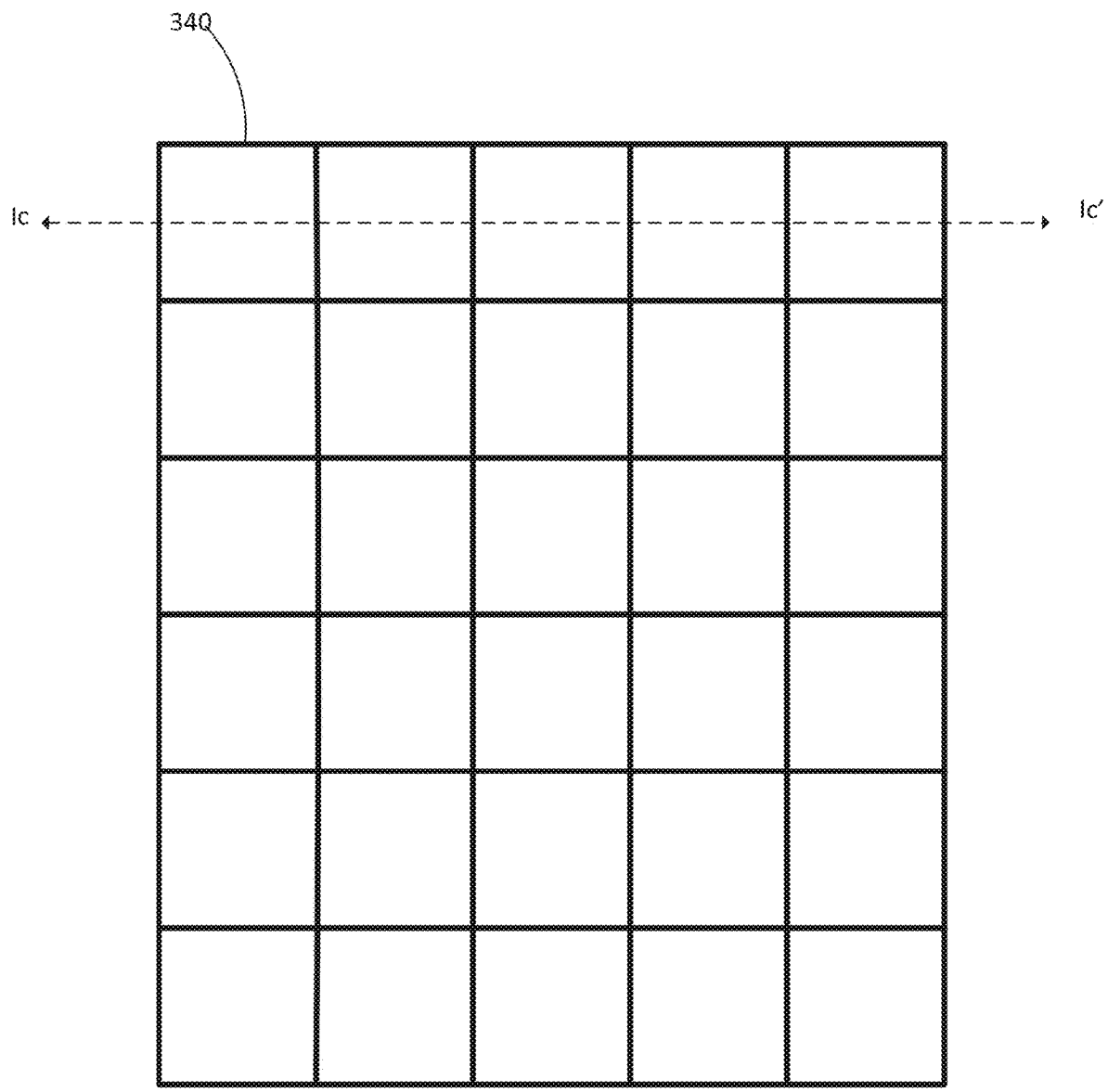

FIGS. 3A-3C illustrate example top down views of a fully buried color filter array at different times during the fabrication of the fully buried color filter array. FIG. 3A illustrates an example view of the pattern of sacrificial material 335 and additional sacrificial material pattern 338. FIG. 1C may be an example of the device of FIG. 3A along the line Ia-Ia'. The additional sacrificial material pattern 338 may be made of the same material, have the same properties, and be formed in a similar manner to the pattern of sacrificial material 335. The blocks of sacrificial material 336 making up the pattern of sacrificial material 335 may form a "checkerboard" pattern. The spaces between the blocks of sacrificial material 336 forming the pattern of sacrificial material 335 may be about the same size and dimensions as the blocks of sacrificial material 336. The additional sacrificial material pattern 338 may be formed to assist in forming spacers 345 on the periphery of the spacer pattern 340. The additional sacrificial material pattern 338 does not need to form blocks with the same dimensions as the blocks of sacrificial material 336 forming the pattern of sacrificial material 335, but only need to define a side wall on which a spacer 345 may be formed in order to complete the spacer pattern 340. Accordingly the blocks of sacrificial material 339 forming the additional sacrificial material pattern 338 may have a different shape than the blocks of sacrificial material 336 forming the pattern of sacrificial material 335.

FIG. 3B illustrates an example view of the pattern of sacrificial material 335 and the additional sacrificial material pattern 338 with the spacer pattern 340 formed on the sides of the pattern of sacrificial material 335. The spacer pattern 340 may form a continuous spacer grid. FIG. 1D may be an example of the device of FIG. 3B along the line Ib-Ib'. The spacers 345 may be formed on sides of the additional sacrificial material pattern 338 in the same manner as the spacers 345 formed on the side walls of the pattern of sacrificial material 335.

FIG. 3C illustrates an example view of the spacer pattern 340 with the pattern of sacrificial material 335 and the additional sacrificial material pattern 338 removed. FIG. 1E may be an example of the device of FIG. 3C along the line Ic-Ic'.

Figure 4:
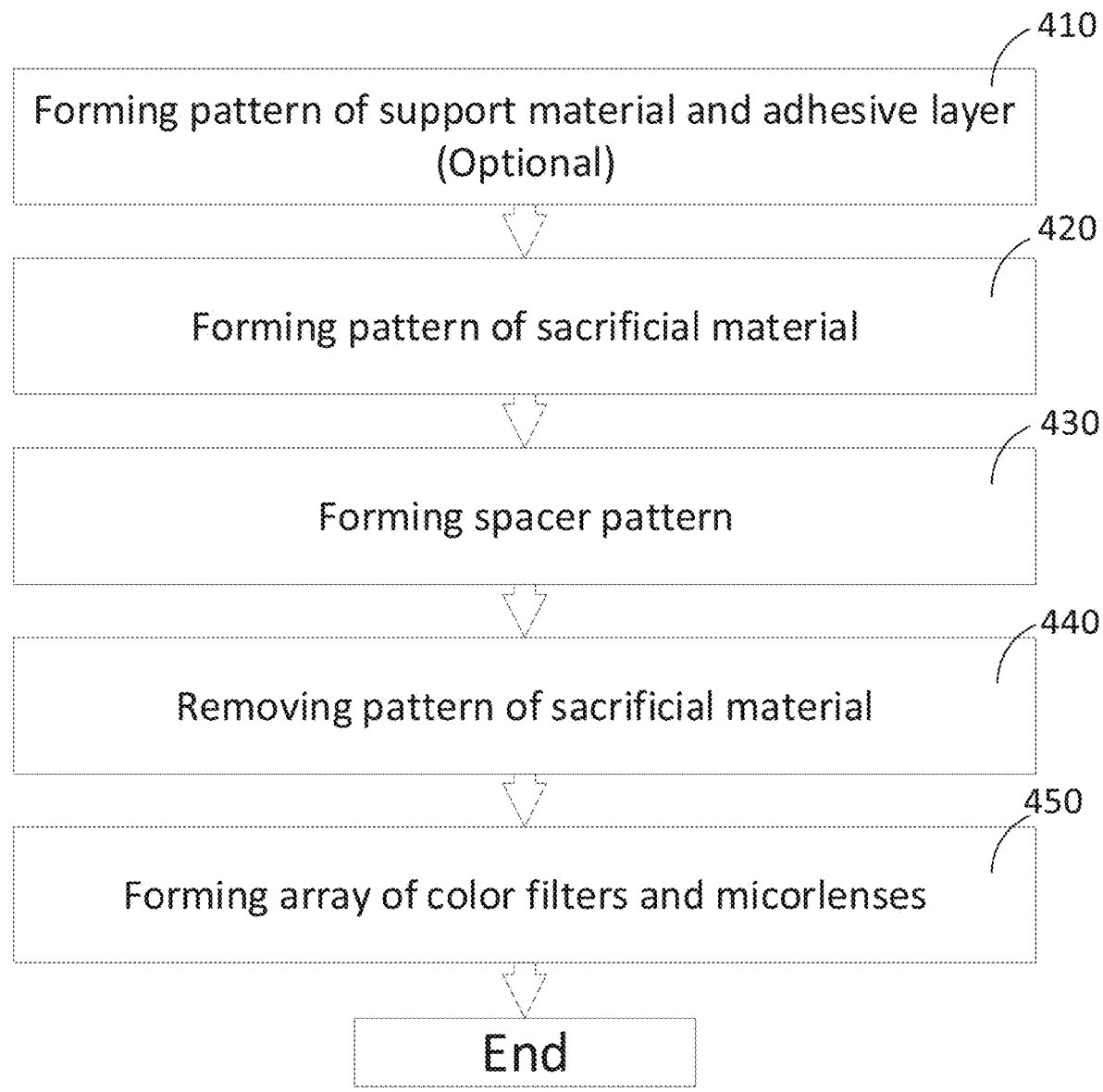
FIG. 4 is a flow diagram illustrating processing steps to fabricate one example of a fully buried color filter array device in accordance with the teachings of the present invention.

FIG. 4 is a flow diagram illustrating processing steps to fabricate one example of a fully buried color filter array device in accordance with the teachings of the present invention. The process of FIG. 4 may be performed on a devices such as the device shown in FIG. 1A. Process block 410 shows the process may begin by forming a pattern of support material 205 and an adhesive layer 208 on the device.

The pattern of support material 205 may be formed by depositing the support material then etching away some of the support material. For example, the support material may be deposited as a blanket layer of aluminum, and then the blanket layer of aluminum may be etched to form the pattern of support material 205. The pattern of support material may define a square or rectangular grid matching the spacer pattern 340 shown in FIGS. 3B-3C, but with wider "lines" in the grid.

In an embodiment, the adhesive layer 208 may be formed on top of the pattern of support material 205 by a vapor deposition process. A nitride hard mask is formed on the adhesive layer 208 on top of the pattern of support material 205, and an etching process may remove adhesive material that was deposited in locations not covered by the nitride hard mask. The nitride hard mask may then be removed. The adhesive layer 208 may also be formed by any other process that deposits the adhesive layer 208 on top of the pattern of support material 205 and not the buffer layer 220. Forming the pattern of support material 205 and the adhesive layer 208 is optional and may not be performed.

Process block 420 shows that the pattern of sacrificial material 135 or 235 is formed. If the pattern of support material 205 and an adhesive layer 208 on the device are formed, then a layer of sacrificial material 230 may be formed on top of the pattern of support material 205, an adhesive layer 208, and the buffer layer 220. Otherwise, the layer of sacrificial material 130 may be formed on the buffer layer 120.

The layer of sacrificial material 130 or 230 may be formed by deposition, for example by chemical vapor deposition (CVD). In one embodiment, a chemical mechanical polishing or planarization process may be applied after the deposition of layer of sacrificial material 130 or 230 to smooth or flattening the surface of layer of sacrificial material 230. The layer of sacrificial material 130 or 230 may be etched by a dry etching process in order to form the pattern of sacrificial material 135. The pattern of sacrificial material 235 may be etched using the same process as described with relation to the pattern of sacrificial material 135.

Process block 430 shows that the spacer pattern 140 or 240 is formed on the side walls of the sacrificial material. The spacer pattern 140 or 240 may be formed of individual spacers 145 or 245 formed on individual sides of the blocks of sacrificial material 136 or 236 of the pattern of sacrificial material 135 or 235, and also sides of the blocks of sacrificial material 339 of the additional sacrificial material pattern 338. The spacer pattern 140 is formed by depositing the spacer material on sides of the blocks of sacrificial material 136 making up the pattern of sacrificial material 135 or 235, and then etching away excess spacer material from the buffer layer and the top surface of the block of sacrificial material. The deposition may be done by a gas phase chemical process such as atomic layer deposition. The etching may be performed by an anisotropic dry etching process. The etching process may cause a side of the spacer 145 or 245 facing away from the block of sacrificial material to have a slanted portion, slanting toward the block of sacrificial material. Each of spacer 145 or 245 formed may have an aspect ratio of up to 18:1 or greater.

Process block 440 shows that the pattern of sacrificial material 135 or 235 is removed. The pattern of sacrificial material 135 or 235 may be removed by a wet etching process. The removal of the pattern of sacrificial material 135 or 235 leaves the second openings 149 or 249 open. Both the dry etching process and the wet etching process performed on the sacrificial material should not substantially etch the spacers 145 or 245, the adhesive layer 208, the pattern of support material 205 or the buffer layer 120 or 220.

Process block 450 shows that the array of color filters 150 or 250 and microlenses 160 or 260 are formed. The array of color filters 150 or 250 may be formed in the first and second openings 148, 149 or 248, 249. The microlenses 160 or 260 may be formed on the array of color filters 150 or 250.

Figure 5:
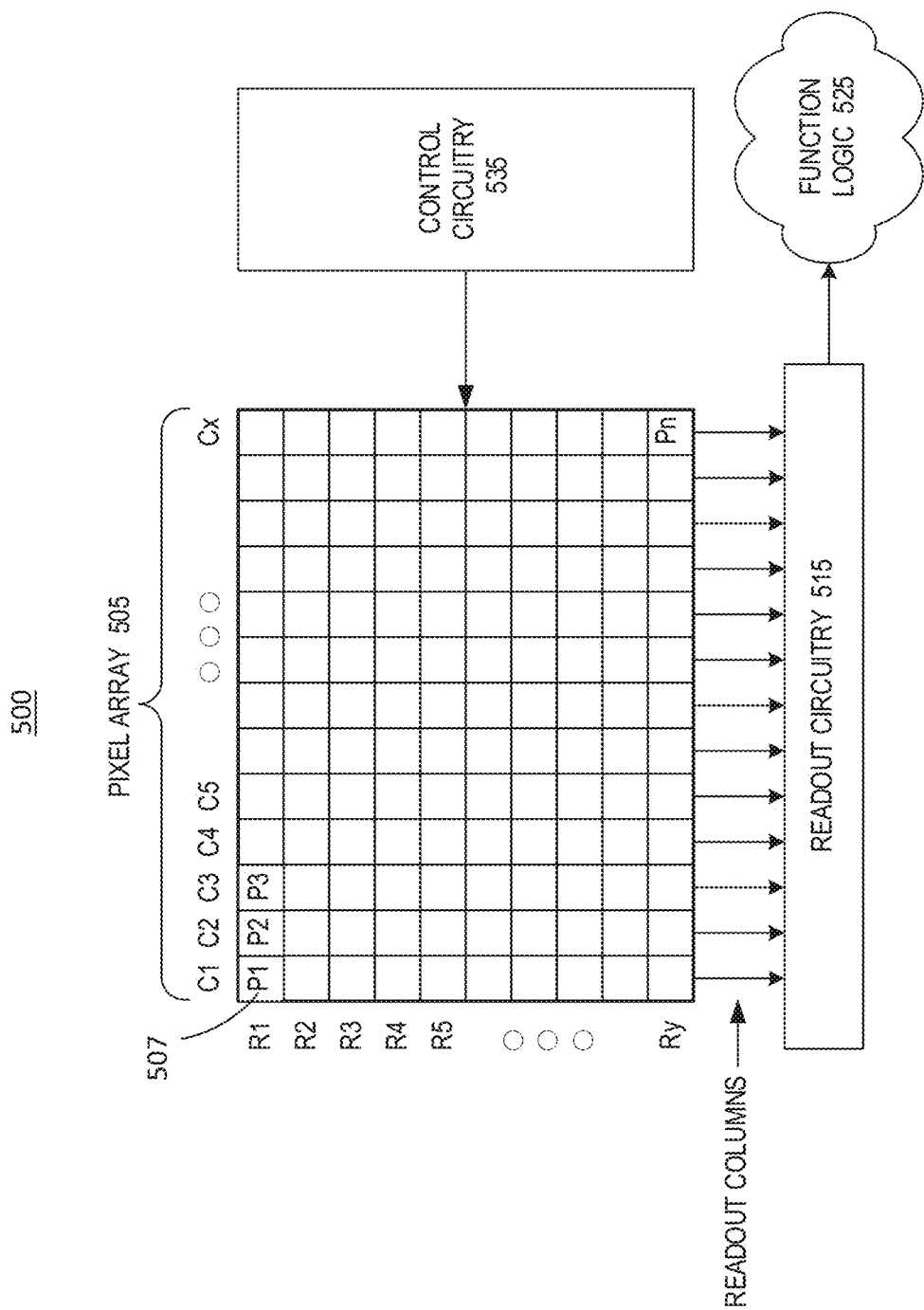
FIG. 5 is a diagram illustrating one example of an imaging system with fully buried color filter array in accordance with the teachings of the present invention.

FIG. 5 is a diagram illustrating one example of an imaging system including a fully buried color filter array in accordance with the teachings of the present invention. As shown in the depicted example, an imaging system 500 includes a pixel array 505 coupled to a control circuitry 535 and a readout circuitry 515, which is coupled to a function logic 525.

Pixel array 505 is a two-dimensional ("2D") array of pixels 507 (e.g., pixels P1, P2 . . . , Pn). In one embodiment, each pixel is a complementary metal-oxide-semiconductor ("CMOS") imaging pixel. Pixel array 505 may be implemented as either a front side illuminated image sensor array or a backside illuminated image sensor array. In one embodiment, pixel array 505 includes a fully buried color filter array, such as the fully buried color filter array depicted in FIG. 1G or 2H. The fully buried color filter array includes a plurality of buried color filters for the pixels 507. The fully buried color filter array may be arranged with pattern, such as Bayer pattern or mosaic of red, green, and blue additive filters (e.g., RGB, RGBG or GRGB), a color filter pattern of cyan, magenta, yellow, and key (black) subtractive filters (e.g., CMYK), a combination of both, or otherwise. As illustrated, each pixel is arranged into a row (e.g., rows R1 to Ry) and a column (e.g., column C1 to Cx) to acquire image data of a person, place, or object, which can then be used to render a 2D image of the person, place, or object.

In one embodiment, after each pixel has acquired its image data or image charge, the image data is readout by readout circuitry 515 and transferred to function logic 525. Readout circuitry 515 may include amplification circuitry e.g., a differential amplifier circuitry, analog-to-digital ("ADC") conversion circuitry, or otherwise.

Function logic 525 may include logic and memory for storing the image data or even manipulating the image data by applying post image effects (e.g., crop, rotate, remove red eye, adjust brightness, adjust contrast, or otherwise). In one example, the readout circuitry 515 may readout a row of image data at a time along readout column lines (illustrated) or may readout the image data using a variety of other techniques (not illustrated), such as a serial readout or a full parallel readout of all pixels simultaneously.

Control circuitry 535 is coupled to pixel array 205. Control circuitry 535 may include logic and memory for controlling operational characteristic of pixel array 505. For example, control circuitry 535 may generate a shutter signal for controlling image acquisition. In one embodiment, the shutter signal is a global shutter signal for simultaneously enabling all pixels 507 within pixel array 505 to simultaneously capture their respective image data during a single acquisition window. In an alternative embodiment, the shutter signal is a rolling shutter signal whereby each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
a substrate, wherein an array of photodiodes is disposed in the substrate;
a plurality of spacers arranged in a spacer pattern to form a spacer grid defining first openings;
a buffer layer disposed between the substrate and the spacer pattern;
an array of color filters disposed in the spacer pattern, wherein the plurality of spacers directly contacts color filters included in the array of color filters; and
a pattern of support material structured to form a support material grid defining second openings overlapping with the first openings defined by the spacer grid, wherein the pattern of support material is disposed between the spacer pattern and the buffer layer, wherein the first openings of the spacer grid are wider than the second openings of the support material grid such that there is a lateral separation distance between edges of individual spacers included in the plurality of spacers and corresponding edges of the pattern of support material where the individual spacers interface with the pattern of support material,
wherein proximal portions of the individual spacers included in the plurality of spacers extend from proximate to the pattern of support material, wherein distal portions of the individual spacers respectively extend from the proximal portions, and wherein each of the distal portions narrows to form a single distal end having a width less than a corresponding uniform width of the proximal portions.

2. The image sensor of claim 1, wherein the spacer pattern extends further from the buffer layer than the array of color filters extends from the buffer layer.

3. The image sensor of claim 1 wherein at least one spacer included in the plurality of spacers has an aspect ratio of at least 18:1.

4. The image sensor of claim 1, wherein a thickness of each one of the plurality of spacers is less than or equal to 0.05 µm.

5. The image sensor of claim 1, wherein each of the color filters included in the array of color filters is disposed in a respectively aligned one of the first openings and the second openings.

6. The image sensor of claim 1, wherein each one of the plurality of spacers consists of a spacer material having a refractive index lower than a refractive index of each color filter included in the array of color filters.

7. The image sensor of claim 1, wherein a combined height of the spacer pattern and the pattern of support material is greater than a height of the array of color filters.

8. The image sensor of claim 1, wherein a portion of support material included in the pattern of support material and disposed between two adjacent second openings included in the second openings has a first width greater than a second width of an individual spacer included in the plurality of spacers.

9. The image sensor of claim 1, wherein the pattern of support material further includes an adhesive layer disposed between the plurality of spacers included in the spacer pattern and a first support material included in the pattern of support material to provide adhesion between the first support material and the spacer pattern.

10. The image sensor of claim 9, wherein the adhesive layer directly contacts the color filters included in the array of color filters.

11. The image sensor of claim 1, further comprising a microlens array, wherein each microlens included in the microlens array extends, at least in part, into a respective opening included in the first openings of the spacer pattern, wherein the array of color filters is disposed between the buffer layer and the microlens array, and wherein the single distal end of the individual spacers are disposed between corresponding adjacent microlenses included in the microlens array.

12. An image sensor, comprising:
a substrate, wherein an array of photodiodes is disposed in the substrate;
a plurality of spacers arranged in a spacer pattern to form a spacer grid defining first openings;
a buffer layer disposed between the spacer pattern and the substrate;
an array of color filters disposed in the spacer pattern; and
a pattern of support material structured to form a support material grid defining second openings, wherein the pattern of support material is disposed between the spacer pattern and the buffer layer, wherein the first openings of the spacer grid are wider than the second openings of the support material grid such that there is a lateral separation distance between edges of individual spacers included in the plurality of spacers and corresponding edges of the pattern of support material where the individual spacers interface with the pattern of support material, and wherein the first openings and the second openings define cavities at least partially filled by the color filters included in the array of color filters,
wherein proximal portions of the individual spacers included in the plurality of spacers extend from proximate to the pattern of support material, wherein distal portions of the individual spacers respectively extend from the proximal portions, and wherein each of the distal portions narrows to form a single distal end having a width less than a corresponding uniform width of the proximal portions.

13. The image sensor of claim 12, wherein the pattern of support material further includes an adhesive layer disposed between the plurality of spacers included in the spacer pattern and a first support material included in the pattern of support material, wherein the plurality of spacers directly contacts the color filters included in the array of color filters.

14. The image sensor of claim 12, wherein at least one spacer included in the plurality of spacers has an aspect ratio of at least 18:1, and wherein a thickness of the individual spacers included in the plurality of spacers is less than or equal to 0.05 µm.

15. The image sensor of claim 12, wherein each one of the second openings is positioned to overlap with a corresponding one of the first openings formed by the plurality of spacers included in the spacer pattern.

16. The image sensor of claim 15, further comprising a microlens array, wherein each microlens included in the microlens array extends, at least in part, into a respective opening included in the first openings of the spacer pattern, wherein the array of color filters is disposed between the buffer layer and the microlens array, and wherein a combined height of the spacer pattern and the pattern of support material is greater than a height of the array of color filters such that the single distal end of the individual spacers are disposed between corresponding adjacent microlenses included in the microlens array.

17. The image sensor of claim 12, wherein the pattern of support material further includes an adhesive layer disposed between the plurality of spacers included in the spacer pattern and a first support material in the pattern of support material, wherein the adhesive layer and the first support material are both etch selective with respect to the buffer layer.

18. The image sensor of claim 12, wherein the pattern of support material directly contacts the color filters included in the array of color filters.

19. The image sensor of claim 12, wherein the plurality of spacers have a composition consisting of a spacer material having a refractive index of 1.3 or less.

20. The image sensor of claim 12, wherein a first pair of the single distal end of a first pair of spacers included in the plurality of spacers that are adjacent to one another are slanted towards each other.

\* \* \* \* \*